United States Patent
Ohkubo et al.

(10) Patent No.: US 6,841,843 B2
(45) Date of Patent: Jan. 11, 2005

(54) SEMICONDUCTOR INTEGRATED CIRCUIT DEVICE

(75) Inventors: Hiroaki Ohkubo, Kanagawa (JP); Yasutaka Nakashiba, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/796,248

(22) Filed: Mar. 9, 2004

(65) Prior Publication Data

US 2004/0188795 A1 Sep. 30, 2004

(30) Foreign Application Priority Data

Mar. 31, 2003 (JP) ........................................ 2003-097294

(51) Int. Cl.[7] .................... H01L 31/058; H01L 29/00
(52) U.S. Cl. .................... 257/467; 257/536; 257/537
(58) Field of Search ........................ 257/467, 468, 257/469, 470, 536, 537

(56) References Cited

U.S. PATENT DOCUMENTS 5,726,481 A * 3/1998 Moody ........................ 257/467
6,104,075 A * 8/2000 Karaki ........................ 257/467
6,720,635 B1 * 4/2004 Koch et al. .................. 257/417

FOREIGN PATENT DOCUMENTS

| JP | 63-300523 | 12/1988 |
|----|-----------|---------|
| JP | 1-302849  | 12/1989 |
| JP | 9-229778  | 9/1997  |

* cited by examiner

Primary Examiner—Ngân V. Ngô
(74) Attorney, Agent, or Firm—Scully, Scott, Murphy & Presser

(57) ABSTRACT

In a semiconductor integrated circuit device, an integrated circuit portion is provided on a surface of a P-type silicon substrate and in a multilayer interconnection layer. The semiconductor integrated circuit device also includes a temperature sensor portion. At the higher level than the multilayer interconnection layer, a sheet member formed of vanadium oxide is provided. The sheet member and a resistor are connected in series between a ground potential wiring and a power-supply potential wiring, and an output terminal is connected to a connection point between the sheet member and the resistor.

9 Claims, 6 Drawing Sheets

SEMICONDUCTOR INTEGRATED CIRCUIT DEVICE

BACKGROUND OF THE INVENTION

1. Field of the Invention

The present invention relates to a semiconductor integrated circuit device incorporating a monolithic temperature sensor therein.

2. Description of the Related Art

In recent years, demands for monitoring an operating temperature of a semiconductor integrated circuit device have increased. This monitoring aims to prevent breakdown of a device in the semiconductor integrated circuit device by heat and/or to stabilize the operation of a device having characteristics changing in accordance with a temperature of a quartz oscillator or the like in a case where such a device is provided in the semiconductor integrated circuit device.

For example, Japanese Patent Laid-Open Publication No. Hei 1-302849 discloses a technique in which a temperature sensor is provided on the same substrate as an LSI (Large Scale Integrated circuit) in the semiconductor integrated circuit device. According to this technique, when the temperature detected by that temperature sensor exceeds a predetermined temperature, it is determined that abnormal overheating occurs and therefore the LSI is shut off so as to prevent thermal breakdown of the LSI caused by the temperature increase.

Moreover, Japanese Patent Laid-Open Publication No. Hei 9-229778 discloses a technique in which a parasitic PN-junction diode is used as the above temperature sensor, for example. FIG. 1 is a cross-sectional view of a conventional semiconductor integrated circuit device including a temperature sensor described in Japanese Patent Laid-Open Publication No. Hei 9-229778, and FIG. 2 is an equivalent circuit diagram of a temperature sensor portion of the conventional semiconductor integrated circuit device shown in FIG. 1.

As shown in FIG. 1, this conventional semiconductor integrated circuit device 21 is formed by a P-type silicon substrate P-Sub and a multilayer interconnection layer M21 formed on the P-type silicon substrate P-Sub. The multilayer interconnection layer M21 is formed by alternately depositing a plurality of wiring layers and a plurality of insulation layers. In this semiconductor integrated circuit device 21, an integrated circuit portion 2 is provided in a predetermined region of a surface of the P-type silicon substrate P-Sub and a predetermined region of the multilayer interconnection layer M21, and a temperature sensor portion 23 is provided in a region of the surface of the P-type silicon substrate PSub and a region of the multilayer interconnection layer M21, in which the integrated circuit portion 2 is not formed.

In the integrated circuit portion 2, a CMOS (Complementary Metal Oxide Semiconductor) circuit 4 is provided, for example. In the CMOS circuit 4, an N-well NW1 and a P-well PW1 are formed to be adjacent to each other on the surface of the P-type silicon substrate PSub. On the surface of the N-well NW1, two $p^+$ diffused regions P1 and P2 serving as source/drain regions are formed to be spaced away from each other. On the surface of the P-well PW1, two $n^+$ diffused regions N1 and N2 serving as source/drain regions are formed to be spaced away from each other. A region between the $p^+$ diffused regions P1 and P2 in the N-well NW1 serves as a channel region 5. Similarly, a region between the $n^+$ diffused regions N1 and N2 in the P-well PW1 serves as a channel region 6.

In regions of the multilayer interconnection layer 21 directly above the channel regions 5 and 6, a gate insulator (not shown) is provided. In regions on the gate insulator that are directly above the channel regions 5 and 6, gate electrodes G1 and G2 formed of polysilicon, for example, are provided, respectively. The gate electrodes G1 and G2 are connected to a gate terminal Vg that is common to the gate electrodes G1 and G2. In the above structure, the channel region 5, the $p^+$ diffused regions P1 and P2 serving as the source/drain regions, the gate insulator, and the gate electrode G1 form a P-type MOS transistor. Similarly, the channel region 6, the $n^+$ diffused regions N1 and N2 serving as the source/drain region, the gate insulator, and the gate electrode G2 form an N-type MOS transistor.

In a region of the multilayer interconnection layer M21 on the $p^+$ diffused region P1, a via hole V1 is provided to connect with the $p^+$ diffused region P1. On the via hole V1, a wiring W1 is provided to connect with the via hole V1. On the wiring W1, a via hole V2 is provided to connect with the wiring W1. On the via hole V2, a power-supply potential wiring Vcc is provided to connect with the via hole V2. Thus, the $p^+$ diffused region P1 is connected to the power-supply potential wiring Vcc via the via hole V1, the wiring W1, and the via hole V2.

Moreover, in the multilayer interconnection layer M21, a via hole V3 is provided on the $p^+$ diffused region P2 so as to connect with the $P^+$ diffused region P2, and a via hole V4 is provided on the $n^+$ diffused region N1 so as to connect with the $n^+$ diffused region N1. On those via holes V3 and V4, a wiring W2 is provided to connect with both the via holes V3 and V4. On the wiring W2, a via hole V5 is provided to connect with the wiring W2. On the via hole V5, a wiring W3 is provided to connect with the via hole V5. In this manner, the $p^+$ diffused region P2 and the $n^+$ diffused region N1 are connected to the wiring W3 via the via holes V3 and V4, the wiring W2, and the via hole V5.

Furthermore, a via hole V6 is provided in a region of the multilayer interconnection layer M21 on the $n^+$ diffused region N2 so as to connect with the $n^+$ diffused region N1, and a wiring W4 is provided on the via hole V6 so as to connect with the via hole V6. On the wiring W4, a via hole v7 is provided to connect with the wiring W4. On the via hole V7, a ground potential wiring GND is provided to connect with the via hole V7. In this manner, the $n^+$ diffused region N2 is connected to the ground potential wiring GND via the via hole V6, the wiring W4, and the via hole V7.

On the other hand, another $p^+$ diffused region P3 is formed in a region on the surface of the P-type silicon substrate PSub other than the regions where the N-well NW1 and the P-well PW1 are formed. In a region of the multilayer interconnection layer M21 above the $P^+$ diffused region P3, a via hole V8, a wiring W5, a via hole V9, and a ground potential wiring GND are provided in that order from the bottom, thereby the $P^+$ diffused region P3 is connected to the ground potential wiring GND via the via hole V8, the wiring W5, and the via hole V9.

In the temperature sensor portion 23, an N-well NW2 is formed on the surface of the P-type silicon substrate PSub, and a $p^+$ diffused region P21 and an $n^+$ diffused region N21 are formed on the surface of the N-well NW2 to be spaced away from each other. In a region of the multilayer interconnection layer 21 above the $P^+$ diffused region P21, a via hole 21, a wiring 21, a via hole 22 and a ground potential wiring GND are provided in that order from the bottom, thereby the $P^+$ diffused region P21 is connected to the ground potential wiring GND via the via hole V21, the wiring W21, and the via hole V22.

In a region of the multilayer interconnection layer M21 above the n+ diffused region N21, a via hole V23 is provided to connect with the n+ diffused region N21, and a wiring W22 is provided on the via hole V23. The wiring W22 is connected to the via hole V23 at one end thereof and also connected to an output terminal Vout21. Under the wiring W22, a via hole V24 is provided to connect with the other end of the wiring W22. Under the via hole V24, a resistor R, formed of polysilicon, for example, is provided. The resistor R has a sheet-like shape and is connected to the via hole V24 at one end. The resistor R is formed simultaneously with the formation of the gate electrodes G1 and G2 of the CMOS circuit 4, and is therefore provided on the same level as the gate electrodes G1 and G2. Moreover, a via hole V25 is provided on the resistor R so as to connect with the other end of the resistor R. Furthermore, a wiring W23, a via hole V26, and a power-supply potential wiring Vcc are provided on the via hole V25 in that order from the bottom, thereby the resistor R is connected to the power-supply potential wiring Vcc via the via hole V25, the wiring w23, and the via hole V26.

Thus, a potential higher than that applied to the P+ diffused region P21 is applied to the N-well NW2. As a result, a forward PN junction is formed between the P+ diffused region P21 and the N-well NW2, thereby a parasitic PN-junction diode D is formed.

In the multilayer connection layer M21, the via holes V1, V3, V4, V6, V8, V21, and V23 are provided in the first insulation layer in which the gate electrodes G1 and G2 and the resistor R are also provided at the same level. Moreover, the wirings W1, W2, W4, W5, W21, W22, and W23 are provided in the first wiring layer provided on the first insulation layer to be at the same level mutually, and the via holes V2, V5, V7, V9, V22, and V26 are provided in the second insulation layer provided on the first wiring layer. In addition, the respective ground potential wirings GND, the respective power-supply potential wirings vcc, and the wiring W3 are provided in the second wiring layer provided on the second insulation layer to be at the same level mutually. Furthermore, regions of the multilayer interconnection layer M21, other than the respective via holes, the respective wirings, and the resistor R, and a layer positioned on the second insulation layer are filled with insulating material 7.

As shown in FIG. 2, in the temperature sensor portion 23 of the semiconductor integrated circuit device 21, the resistor R, and the parasitic PN-junction diode D are connected in series in that order from the power-supply potential wiring Vcc to the ground potential wiring GND, and the output terminal Vout21 is connected to a connection point between the resistor R and the parasitic PN-junction diode D. It should be noted that the parasitic PN-junction diode D is connected in the forward direction.

Thus, as shown in FIG. 1, when the temperature of the semiconductor integrated circuit device 21 changes, the characteristics of the parasitic PN-junction diode D also change. This change of the characteristics causes change of the potential at the output terminal Vout21. By detecting the potential at the output terminal Vout21, the temperature of the semiconductor integrated circuit device 21 can be measured. Moreover, in the semiconductor integrated circuit device 21, the parasitic PN-junction diode D can be formed by using a device structure of the MOS transistor. Therefore, the temperature sensor portion 23 can be formed without changing the conventional MOS process.

The conventional technique shown in FIGS. 1 and 2, however, has a problem that the temperature coefficient of the parasitic PN-junction diode D is as small as about 0.002/K and therefore a sufficient SNR (Signal-to-Noise Ratio) cannot be obtained.

Thus, a technique has been proposed in Japanese Patent Laid-Open Publication No. Sho 63-300523, for example, in which a temperature sensor having a structure other than the device structure of the MOS transistor, for example, a temperature sensor using a semiconductor capacitance, is provided in a semiconductor integrated circuit device.

However, this technique has the following problems. In order to monolithically form the temperature sensor having the structure other than the device structure of the MOS transistor in the semiconductor integrated circuit device, the conventional semiconductor process for forming the integrated circuit portion other than the temperature sensor portion has to be changed. This requires a development of new semiconductor process. Moreover, a macro for which the operation has been already tested cannot be used, thus requiring a new test. In this manner, an existing platform cannot be used not only for the temperature sensor portion but also for the integrated circuit portion, so that the fabrication cost of the semiconductor integrated circuit device increases. In addition, some types of material for the temperature sensor may contaminate the inside of the semiconductor integrated circuit device and an apparatus for fabricating the semiconductor integrated circuit device.

SUMMARY OF THE INVENTION

Therefore, it is an object of the present invention to provide a semiconductor integrated circuit device including a temperature sensor, which can use an existing platform for an integrated circuit portion and can be fabricated without contaminating the inside of the semiconductor integrated circuit device and a fabrication apparatus of the semiconductor integrated circuit device.

A semiconductor integrated circuit device according to the present invention includes a semiconductor substrate and a multilayer interconnection layer provided on the semiconductor substrate. The semiconductor integrated circuit device includes: an integrated circuit portion provided in a surface of the semiconductor substrate and in the multilayer interconnection layer; a temperature monitor portion provided at a higher level than the multilayer interconnection layer, the temperature monitor portion having electric characteristics that are changed in accordance with a temperature; and a detector section, connected to the temperature monitor portion, operable to detect the electric characteristics of the temperature monitor portion to measure the temperature.

In the present invention, since the temperature monitor portion is provided at the higher level than the multilayer interconnection layer, a conventional platform can be used in the integrated circuit portion provided in the multilayer interconnection layer even in a case where the temperature sensor adopts a structure other than a device structure of an MOS transistor. In other words, since the temperature monitor portion can be formed after the semiconductor substrate and the multilayer interconnection layer where the integrated circuit portion is provided was formed, the integrated circuit portion can be formed by a conventional fabrication process. Moreover, due to that, the integrated circuit portion and a fabrication apparatus for fabricating the integrated circuit portion are not contaminated even in a case where a special material is used in the temperature monitor portion.

Moreover, at least a part of the integrated circuit portion may be arranged directly below the temperature monitor portion. In this case, a region directly below the temperature monitor portion can be effectively used so as to achieve space saving, thereby reducing the size of the semiconductor integrated circuit device.

The semiconductor integrated circuit device of the present invention may include a plurality of said temperature monitor portions to detect the temperatures of a plurality of positions. In this case, the precision of the temperature measurement can be improved.

The semiconductor integrated circuit device of the present invention may include a bonding pad provided at the lower level than the temperature monitor portion. In this case, it is possible to perform the formation of the components of the semiconductor integrated circuit device until the formation of the bonding pad by a conventional fabrication process.

The temperature monitor portion may be formed of a material having a resistance that changes in accordance with the temperature, and the detector section may detect the resistance of that material. In this case, it is preferable that that the material be a metal oxide, especially vanadium oxide. Since vanadium oxide has a large temperature coefficient of the resistivity and is stable, the temperature monitor portion can be obtained that provides a high SNR and has excellent reliability.

According to the present invention, the monitor portion is provided at the higher level than the integrated circuit portion. Therefore, if a temperature sensor other than the temperature sensor using the device structure of the MOS transistor is used in the semiconductor integrated circuit device, the conventional platform can be used for the integrated circuit portion. Moreover, since the temperature monitor portion can be formed after the formation of the integrated circuit portion, the integrated circuit portion can be formed by a conventional fabrication process and the integrated circuit portion and an apparatus for fabricating the integrated circuit device cannot be contaminated by material for the temperature monitor portion. Therefore, the semiconductor integrated circuit device including the monolithic temperature sensor that can be fabricated at a low cost and has a high performance can be obtained.

DETAILED DESCRIPTION OF THE PREFERRED EMBODIMENT

Figure 3:
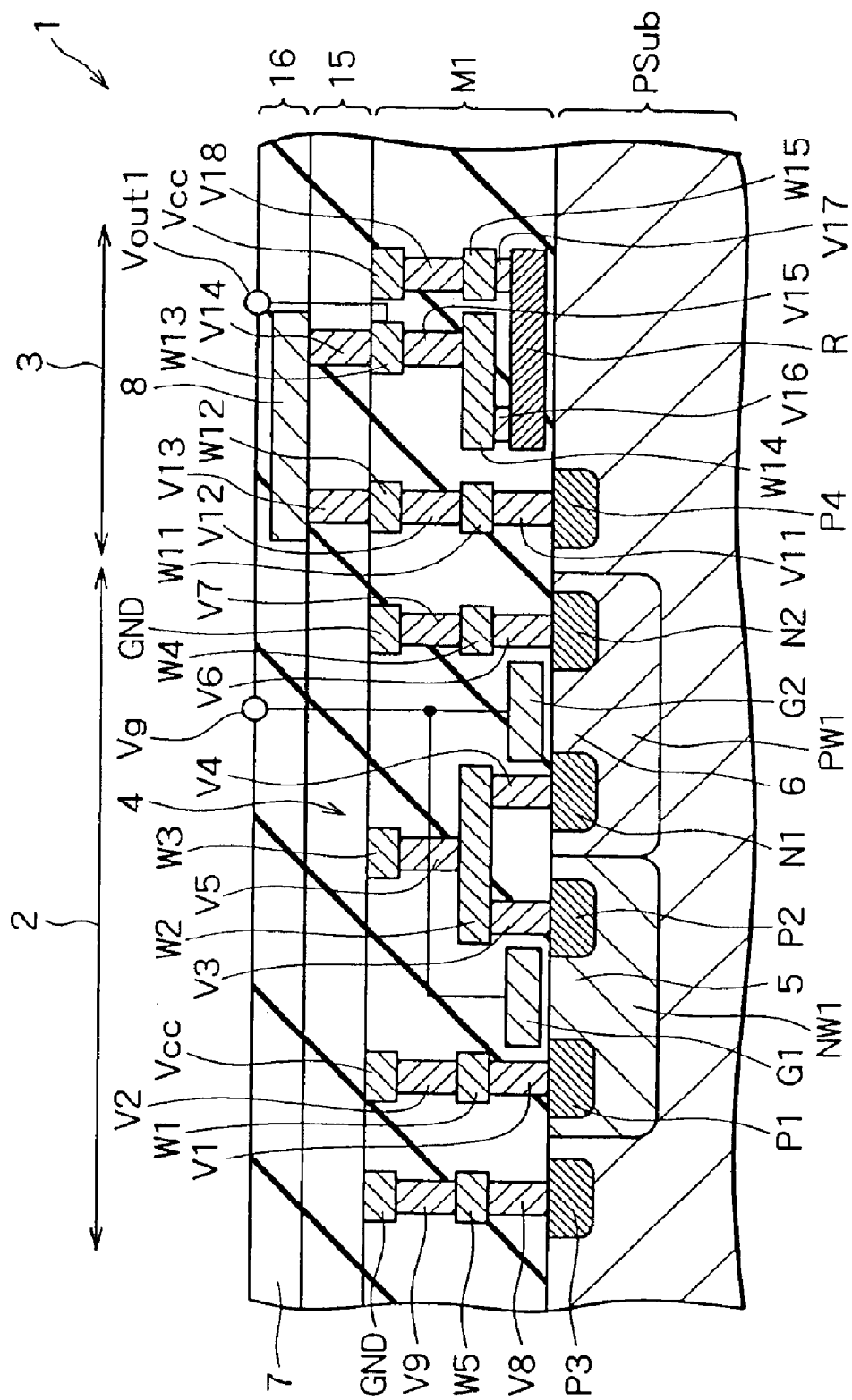
FIG. 3 is a cross-sectional view of a semiconductor integrated circuit device according to a first embodiment of the present invention.
Figure 4:
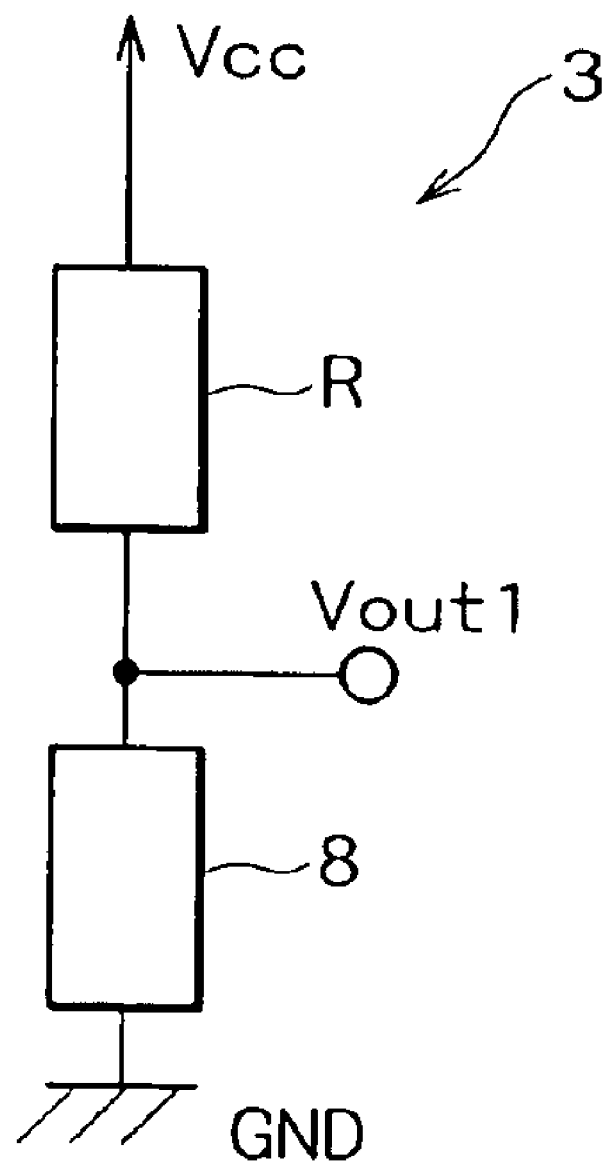
FIG. 4 is an equivalent circuit diagram of a temperature sensor portion of the semiconductor integrated circuit device shown in FIG. 3.

Preferred embodiments of the present invention will be described below, with reference to the accompanying drawings. First, a first embodiment of the present invention is described. FIG. 3 is a cross-sectional view of a semiconductor integrated circuit device according to the first embodiment, and FIG. 4 is an equivalent circuit diagram of a temperature sensor portion thereof. The semiconductor integrated circuit device according to the present embodiment is formed on a single silicon chip.

As shown in FIG. 3, the semiconductor integrated circuit device 1 of the present embodiment includes a P-type silicon substrate PSub, a multilayer interconnection layer M1 formed on the P-type silicon substrate PSub, an insulation layer 15 formed on the multilayer interconnection layer M1, and a sheet layer 16 formed on the insulation layer 15. The multilayer interconnection layer M1 is formed by alternately depositing a plurality of wiring layers and a plurality of insulation layers. The sheet layer 16 is different from the wiring layers in the multilayer interconnection layer M1 in that no normal wiring is formed therein. In the semiconductor integrated circuit device 1 having the above structure, an integrated circuit portion 2 is provided in a predetermined region of a surface of the P-type silicon substrate PSub and a predetermined region of the multilayer interconnection layer M1. In addition, a temperature sensor portion 3 is provided in a region of the surface of the P-type silicon substrate PSub and a region of the multilayer interconnection layer M1, that are other than the region where the integrated circuit portion 2 is formed, and in the insulation layer 15 and the sheet layer 16.

Figure 1:
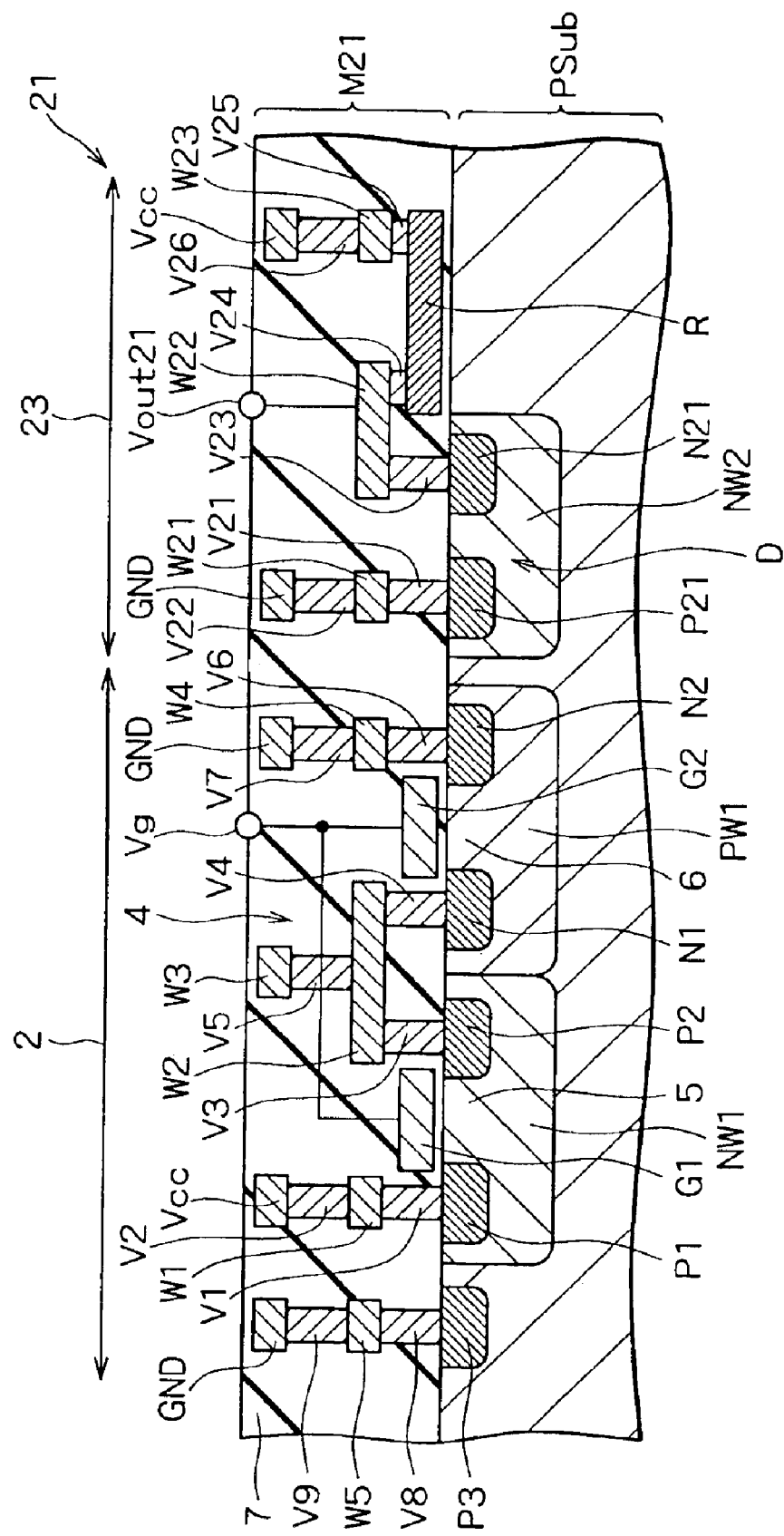
FIG. 1 is a cross-sectional view of a conventional semiconductor integrated circuit device including a temperature sensor.
Figure 2:
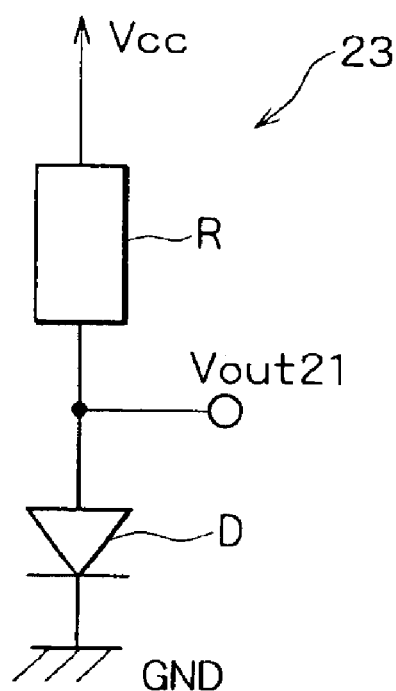
FIG. 2 is an equivalent circuit diagram of a temperature sensor portion of the conventional semiconductor integrated circuit device shown in FIG. 1.

The structure of the integrated circuit device 2 is the same as that of the integrated circuit device 2 of the conventional semiconductor integrated circuit device 21 shown in FIG. 1. More specifically, the integrated circuit portion 2 performs various processes including an operation and a storage, for example, and includes a device such as a CMOS circuit 4. The integrated circuit portion 2 may include a circuit for performing data processing for the measurement result of the temperature sensor portion 3. Please note that a device other than the CMOS circuit 4 is also provided in the integrated circuit portion 2 although that device is not shown in FIG. 3.

In the temperature sensor portion 3, a $P^+$ diffused region P4 is formed in a part of the surface of the P-type silicon substrate PSub. In a region of the multilayer interconnection layer M1 on the $P^+$ diffused region P4, a via hole V11 is provided to connect with the $p^+$ diffused region P4. On the via hole V11, a wiring W11 is provided to connect with the via hole V11. Moreover, a via hole V12 is provided on the wiring W11 so as to connect with the wiring W11, and a wiring W12, is provided on the via hole V12 so as to connect with the wiring W12. In a region of the insulation layer 15 on the wiring W12, a via hole V13 is provided to connect with the wiring W12.

Moreover, in a region of the sheet layer 16 on the via hole V13, a sheet member 8 serving as a temperature monitor portion is provided. That is, the sheet member 8 is provided at the higher level than the multilayer interconnection layer M1. The shape of the sheet member 8 is a square when seen from a direction perpendicular to the surface of the P-type silicon substrate PSub. The length of one side of that square is 10–20 μm, for example, and the thickness of the sheet member 8 is 0.1–0.2 μm, for example. On the opposed sides of the sheet member 8, electrodes (not shown) are respectively provided, one of which is connected to the via hole V13.

The sheet member 8 is formed of vanadium oxide, for example. Stable compounds of vanadium oxide are $VO_2$ and $V_2O_5$, for example, and are represented by chemical formula, $VO_x$, where x is about 2. The volume resistivity of vanadium oxide at 25° C. is from about 0.01 to about 10 (Ω·cm) on silicon wafer, for example, and the temperature coefficient is from about −0.02 to about −0.03 (/K). The resistance of the sheet member 8 is several hundreds of ohms, for example. It is 300 Ω in one example.

A via hole V14 is provided in a region of the insulation layer 15 below the sheet member 8 so as to connect with the other electrode (not shown) of the sheet member 8. In a region of the multilayer interconnection layer M1 below the via hole V14, a wiring W13 is provided to connect with the via hole V14. To the wiring W13 is connected an output terminal Vout1. Moreover, a via hole V15 is provided below the wiring W13 so as to connect with the wiring W13, a wiring W14 is provided below the via hole V15 so as to connect with the via hole V15, and a via hole V16 is provided below the wiring W14 so as to connect with the wiring W14.

Below the via hole V16, a resistor R, formed of polysilicon, for example, is provided. The resistor R has a sheet-like shape and is connected to the via hole V16 at one end. The resistor R is formed simultaneously with the formation of the gate electrodes G1 and G2 of the CMOS circuit 4 in the integrated circuit portion 2, and are therefore provided at the same level as the gate electrodes G1 and G2. The shape of the resistor R is a square sheet when seen from the direction perpendicular to the surface of the P-type silicon substrate PSub. The length of one side of that square is 10–20 $\mu$m, for example, and the thickness of the resistor R is 0.2–0.3 $\mu$m, for example. Moreover, the resistance of the resistor R is set to be substantially equal to that of the sheet member 8, for example. The resistance of the resistor R is several hundreds of ohms, for example, or 300 Ω, for example.

On the resistor R, a via hole V17 is provided to connect with the other end of the resistor R. Moreover, a wiring W15 is provided on the via hole V17 so as to connect with the via hole V17, a via hole V18 is provided on the wiring W15 so as to connect with the wiring W15, and a power-supply potential wiring Vcc is provided on the via hole V18 so as to connect with the via hole V18.

In this manner, from the P+ diffused region P4 to the power-supply potential wiring vcc, the via hole V11, the wiring w11, the via hole V12, the wiring W12, the via hole V13, the sheet member 8, the via hole V14, the wiring W13, the via hole V15, the wiring W14, the via hole V16, the resistor R, the via hole V17, the wiring W15, and the via hole V18 are connected in series in that order. In addition, the P+ diffused region P4 is connected to a ground potential wiring GND of the integrated circuit portion 2 via the P-type silicon substrate PSub, the p+ diffused region P3, the via hole V8, the wiring W5, and the via hole V9.

Furthermore, the P+ diffused region P4 of the P-type silicon substrate PSub, the via holes V11 to V18, the wiring W11 to W15, and the resistor R form together detector section, and that detector section and the sheet member 8 serving as the temperature monitor portion form the temperature sensor portion 3'.

In the semiconductor integrated circuit device 1 of the present embodiment having the aforementioned structure, a circuit in which the resistor R and the sheet member 8 are connected in series in that order from the power-supply potential wiring Vcc to the ground potential wiring GND is formed in the temperature sensor portion 3, as shown in FIG. 4. To the connection point between the resistor R and the sheet member 8, the output terminal Vout1 is connected.

In the multilayer interconnection layer M1, the via holes V1, V3, V4, V6, V8, V11, V16, and V17 are provided in the first insulation layer in which the gate electrodes G1 and G2 and the resistor R are provided at the same level. Moreover, the wirings W1, W2, W4, W5, Wl1, W14, and W15 are provided in the first wiring layer provided on the first insulation layer to be mutually positioned at the same level. The via holes V2, V5, V7, V9, V12, V15, and V18 are provided in the second insulation layer provided on the first wiring layer.

In addition, the respective ground potential wirings GND, the respective power-supply potential wirings Vcc, the wirings W3, W12, and W13 are provided in the second wiring layer provided on the second insulation layer to be mutually positioned at the same level. The via holes V13 and V14 are provided in the insulation layer 15 provided on the multilayer interconnection layer M1. The sheet member 8 is provided in the sheet layer 16 provided on the insulation layer 15. Regions of the multilayer interconnection layer M1, the insulation layer 15, and the sheet layer 16, which are other than the respective via holes, the respective wirings, the resistor R, and the sheet member 8, and a layer positioned on the sheet member 8 are filled with insulation material 7.

As described above, in the semiconductor integrated circuit device 1, the integrated circuit portion 2 is provided in the P-type silicon substrate PSub and the multilayer interconnection layer M1 but is not provided in the insulation layer 15 and the sheet layer 16 that are positioned above the multilayer interconnection layer M1. On the other hand, the sheet member 8 of the temperature sensor portion 3 is provided in the sheet layer 16.

Next, a method for fabricating the semiconductor integrated circuit device 1 is described with reference to FIG. 3. In the present embodiment, after an N-well NW1, a P-well PW1, n+ diffused regions N1 and N2, and P+ diffused regions P1, P2, P3, and P4 were formed in the surface of the P-type silicon substrate PSub by a normal process, the multilayer interconnection layer M1 is formed from the bottom. In the formation of the multilayer interconnection layer M1, the resistor R is formed simultaneously with the formation of the gate electrodes G1 and G2. However, when impurities are implanted to the gate electrodes G1 and G2, the resistor R is covered with a mask so as to limit the implantation of impurities to the resistor R. By controlling the concentration of the impurities implanted to the resistor R, the resistivity of the resistor R is adjusted. Then, the insulation layer 15 is formed, on the multilayer interconnection layer M1 and thereafter the via holes V13 and V14 are formed in the insulation layer 15. Then, the sheet member 8 is formed on the insulation layer 15 by sputtering and thereafter the insulation material 7 is applied so as to embed the sheet member 8 therein. Thus, the sheet layer 16 is formed. In this manner, the semiconductor integrated circuit device 1 of the present embodiment is fabricated.

Next, an operation of the semiconductor integrated circuit device 1 of the present embodiment having the aforementioned structure is described. When a ground potential is applied to the ground potential wiring GND and a power-supply potential is applied to the power-supply potential wiring Vcc, the potential at the output terminal Vout1 becomes an intermediate value between the ground potential and the power-supply potential, which is determined by the resistance value of the sheet member 8 and that of the resistor R. Then, when the outside temperature has increased, or when driving of the integrated circuit portion 2 has generated heat and therefore the temperature of the semiconductor integrated circuit device 1 has increased, the temperature of the sheet member 8 has also increased and the resistance value thereof has decreased. Because the temperature coefficient of the resistivity of vanadium oxide that forms the sheet member 8 is from about 0.02 to about −0.03, the resistance value of the sheet member 8 is reduced by about 2–3% when the temperature has increased by 1° C. By detecting the potential at the output terminal Vout1, the temperature of the semiconductor integrated circuit device 1 is measured.

Based on the measurement result of the temperature, the integrated circuit portion 2 is controlled. For example, when the measured value of the temperature exceeded a predetermined value, it is determined that the integrated circuit portion 2 is overheated and therefore the driving of the integrated circuit portion 2 is stopped.

In the present embodiment, the sheet member 8 is provided in the sheet layer 16 positioned above the multilayer interconnection layer M1, and the integrated circuit portion 2 is not provided in that sheet layer 16 but is provided in the wiring layers that are positioned at the lower level than the sheet layer 16. Therefore, an existing macro can be used for the integrated circuit portion 2. In addition, since the sheet member 8 can be formed after the formation of the integrated circuit portion 2, the integrated circuit portion 2 can be formed by a conventional fabrication process. Therefore, for the integrated circuit portion 2, it is not necessary to alter an existing platform. As a result, the increase of the fabrication cost caused by providing the sheet member 8 can be suppressed. Moreover, vanadium oxide does not contaminate the integrated circuit portion 2 and a semiconductor fabrication apparatus for fabricating the integrated circuit portion 2.

Moreover, for vanadium oxide, the absolute value of the temperature coefficient of the resistivity is about 0.02–0.03 and this value is larger than an absolute value of a temperature coefficient of a parasitic PN-junction diode, 0.002. Therefore, it is possible to obtain a high SNR in the temperature measurement. In addition, since vanadium oxide is chemically stable, the reliability of the temperature sensor portion 3 can be improved, thus improving the reliability of the semiconductor integrated circuit device 1.

Furthermore, it is possible to appropriately control the integrated circuit portion 2 by controlling it based on the result of the temperature measurement in the temperature sensor portion 3. For example, breakdown of the integrated circuit portion 2 caused by overheating of the integrated circuit portion 2 can be prevented.

Although an example where the temperature sensor portion 3 is formed in a region other than the region where the integrated circuit portion 2 is formed is described in the present embodiment, the sheet member 8 may be formed in a part of a region directly above the integrated circuit portion 2. In other words, a part of the integrated circuit portion 2 may be arranged directly below the sheet member 8. In this case, the region directly below the sheet member 8 can be effectively used so as to achieve space saving. This is advantageous to reduce the layout area of the semiconductor integrated circuit device 1 as well as the size reduction thereof.

The temperature sensor portion 3 may be formed in a single location on the chip on which the semiconductor integrated circuit device 1 is formed, or in each of a plurality of locations. For example, the temperature sensor portion 3 may be formed on each of the center and four corners of the chip, i.e., five locations on the chip. By providing a plurality of temperature sensor portions 3 in a plurality of locations, respectively, and calculating an average of the measured values of the respective temperature sensor portions 3, the precision of the temperature measurement can be further improved.

Although a single sheet member 8 is provided in the present embodiment, the present invention is not limited thereto. A plurality of sheet members 8 may be provided. In this case, it is preferable that a plurality of sheet members 8 be provided in the uppermost layer of the semiconductor integrated circuit device 1. However, in order to reduce the layout area, the sheet members 8 may be provided in the uppermost layer of the semiconductor integrated circuit device 1 and the layer lower than the uppermost layer. Please note that, in this case, it is also necessary to provide the sheet members 8 in the layer higher than the multilayer interconnection layer M1 in which the integrated circuit portion 2 is provided.

Moreover, the structure of the temperature sensor portion 3 is not limited to the structure shown in FIG. 3. For example, the output terminal Vout1 may be connected to the wiring W14. In addition, the multilayer interconnection layer M1 may include three or more wiring layers.

Figure 5:
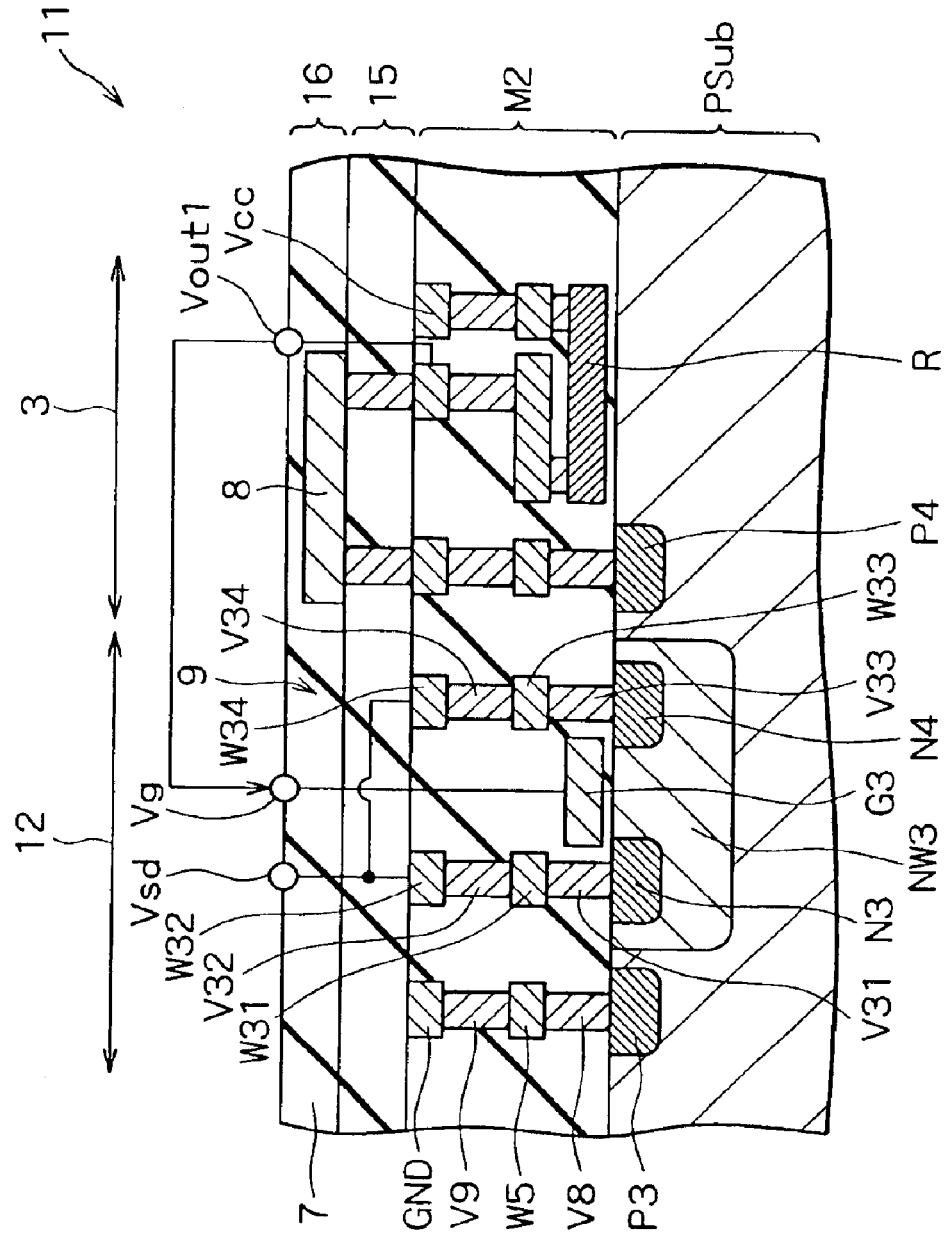
FIG. 5 is a cross-sectional view of a semiconductor integrated circuit device according to a second embodiment of the present invention.

Next, a second embodiment of the present invention is described. FIG. 5 is a cross-sectional view of a semiconductor integrated circuit device according to the second embodiment of the present invention. The same components in FIG. 5 as those in FIG. 3 are labeled with the same reference numerals as those in FIG. 3 and the detailed description thereof is omitted. As shown in FIG. 5, the semiconductor integrated circuit device 11 of the present embodiment is characterized in that a varactor device 9 is provided in an integrated circuit portion 12. More specifically, the semiconductor integrated circuit device 11 is formed by a P-type silicon substrate PSub and a multilayer interconnection layer M2, and includes the integrated circuit portion 12 and the temperature sensor portion 3. The varactor device 9 is provided in the integrated circuit portion 12, and the output of the temperature sensor portion 3 is input to the varactor device 9. Although the integrated circuit portion 12 includes a device such as a CMOS circuit, the device other than the varactor device 9 in the integrated circuit portion 12 is not shown in FIG. 5. Except for the above, the structure of the semiconductor integrated circuit device 11 of the present embodiment is the same as that of the semiconductor integrated device 1 of the first embodiment described above.

The varactor device 9 is a voltage-controlled variable capacitance terminal. The varactor device 9 may form an LC resonant circuit together with an inductor (not shown), for example. This LC resonant circuit may be a part of an LC-VCO (Voltage Controlled Oscillator), for example.

In the varactor device 9, an N-well NW3 is formed in the surface of the P-type silicon substrate PSub. Moreover, n$^+$ diffused regions N3 and N4 are formed in two regions of the surface of the N-well NW3 that are spaced away from each other. In a region of the multilayer interconnection layer M2 directly above the n$^+$ diffused region N3, a via hole V31, a wiring W31, a via hole V32, and a wiring W32 are provided in that order from the bottom, i.e., from a region close to the n$^+$ diffused region N3, and are connected in series. In a region of the multilayer interconnection layer M2 directly above the n$^+$ diffused region N4, a via hole V33, a wiring W33, a via hole V34, and a wiring W34 are provided in that order from the bottom, and are connected in series. The wirings W32 and W34 are connected to a source/drain terminal Vsd in common. Moreover, in a region directly above a region of the N-well NW3 between the n⁺ diffused regions N3 and N4, a gate insulator (not shown) is provided. On this gate insulator, a gate electrode G3, formed of polysilicon, for example, is provided. The gate electrode G3 is connected to a gate terminal Vg to which a signal output from the output terminal Vout1 of the temperature sensor portion 3 is input.

The via holes V31 and V33 and the gate electrode G3 are provided in the first insulation layer, the wirings W31 and W33 are provided in the first wiring layer, the via hole V32 and V34 are provided in the second insulation layer, and the wirings W32 and W34 are provided in the second wiring layer.

Next, an operation of the semiconductor integrated circuit device 11 of the present embodiment is described. The temperature sensor portion 3 outputs a potential signal in accordance with the temperature from the output terminal Vout1 by the operation similar to that in the first embodiment. This potential signal is input to the gate terminal Vg of the integrated circuit portion 12. Thus, when the temperature of the semiconductor integrated circuit 11 has changed, the resistance of the sheet member 8 changes, and the potential input to the gate terminal Vg of the integrated circuit portion 12 also changes.

Therefore, a potential applied across the source/drain terminal Vsd and the gate terminal Vg changes in the varactor device 9. This causes the change of the thickness of a depletion layer in a region of the N-well NW3 directly below the gate electrode G3 and the change of the capacitance value between the N-well NW3 and the gate electrode G3. More specifically, when the potential at the gate electrode G3 with respect to the N-well NW3 is sufficiently high, the varactor device 9 is placed in an accumulation mode and the effective thickness of the capacitor-insulation film is substantially equal to the thickness of the gate electrode G3. Therefore, the capacitance value between the N-well NW3 and the gate electrode G3 is the maximum. From this state, when the potential at the gate electrode G3 with respect to the N-well NW3 has decreased, the depletion layer is formed in the region of the N-well NW3 directly below the gate electrode G3 and the effective thickness of the capacitor-insulation film becomes thicker, resulting in the reduction of the capacitance value between the N-well NW3 and the gate electrode G3. In this manner, since the capacitance value changes depending on the potential input to the gate terminal Vg, the temperature of the semiconductor integrated circuit device 11 can be obtained as the capacitance value of the varactor device 9. In a case where the varactor device 9 forms an LC-VCO together with an inductor, a frequency of an AC signal generated by oscillation of the LC-VCO changes in accordance with the capacitance value of the varactor device 9. Therefore, the temperature of the semiconductor integrated circuit device 11 can be obtained as the frequency of the AC signal generated by oscillation of the LC-VCO. In this manner, the varactor device 9 of the integrated circuit portion 12 is controlled based on the signal output from the output terminal Vout1 of the temperature sensor portion 3.

As described above, according to the present embodiment, the temperature of the semiconductor integrated circuit device 11 can be obtained as the capacitance value or the frequency of the AC signal. The advantageous effects of the present embodiment other than those described in the present embodiment are the same as those achieved in the first embodiment.

Figure 6:
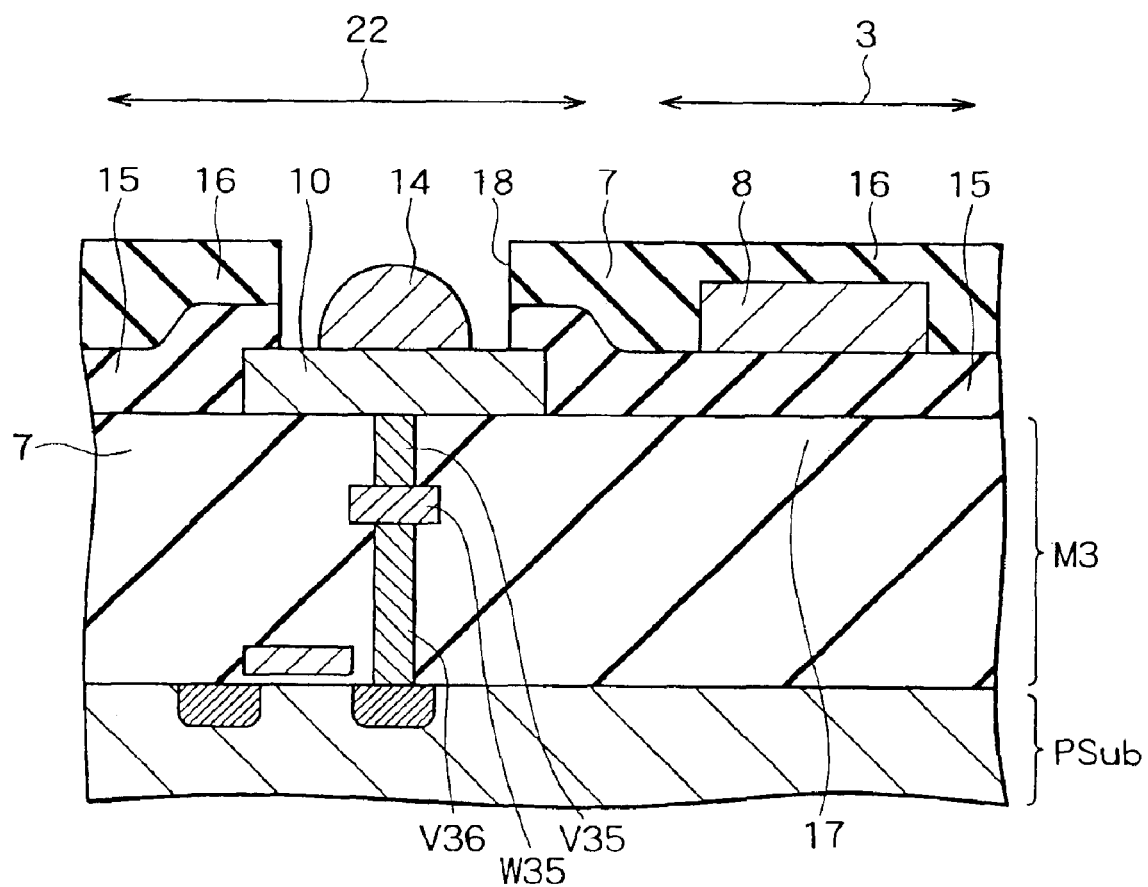
FIG. 6 is a cross-sectional view of a semiconductor integrated circuit device according to a third embodiment of the present invention.

Next, a third embodiment of the present invention is described. FIG. 6 is a cross-sectional view of a semiconductor integrated circuit device according to the third embodiment of the present invention. As shown in FIG. 6, one feature of the present embodiment is that a bonding pad 10 is provided in an integrated circuit portion 22. The semiconductor integrated circuit device of the present embodiment is formed by a P-type silicon substrate PSub and a multilayer interconnection layer M3, and includes the integrated circuit portion 22 and the temperature sensor portion 3. In the integrated circuit portion 22, the bonding pad 10 is provided. Please note that regions of the integrated circuit portion 22, other than the bonding pad 10 and its surrounding region, and regions of the temperature sensor portion 3, other than the sheet member 8, are omitted in FIG. 6. Except for the difference described above, the structure of the semiconductor integrated circuit device of the present embodiment is the same as that in the first embodiment. In the present embodiment, an insulation layer 17 formed of insulation material 7 is provided in the multilayer interconnection layer M3. The insulation layer 17 is the uppermost layer of the multilayer interconnection layer M3. In the integrated circuit portion 22, the bonding pad 10 is provided on the insulation layer 17. The bonding pad 10 may be provided in the aforementioned second wiring layer, that is, the wiring layer in which the ground potential wiring GND and the power-supply potential wiring Vcc are provided. The bonding pad 10 is formed of metal such as aluminum, for example.

Below the bonding pad 10, a via hole V35 and a wiring W35 are provided, and the bonding pad 10 is connected to the wiring W35 via the via hole V35. Moreover, a via hole V36 is provided below the wiring W35, and the wiring W35 is connected to the P-type silicon substrate PSub via the via hole V36. The wiring w35 may be an input wiring of a CMOS circuit like the wiring W3 shown in FIG. 3, for example.

Moreover, an insulation layer 15 formed of the insulation material 7 is provided on the insulation layer 17 to cover the upper surface of the insulation layer 17 and ends of the bonding pad 10. In the temperature sensor portion 3, the sheet member 8 is provided on the insulation layer 15. Furthermore, a layer formed of the insulation material 7 is provided on the insulation layer 15 so as to cover the upper surface of the insulation layer 15 and the sheet member 8, thus the sheet layer 16 is formed. In a region of the insulation layer 15 and the sheet layer 16 directly above the center region of the bonding pad 10, an opening 18 is formed to expose the bonding pad 10. On the exposed region of the bonding pad 10 is mounted a solder ball 14 to which a wiring (not shown) is bonded.

Next, an operation of the semiconductor integrated circuit device of the present embodiment is described. The integrated circuit portion 22 inputs and outputs a signal to/from the aforementioned wiring bonded to the solder ball 14 via the solder ball 14, the bonding pad 10, the via hole V35, and the wiring W35. Except for this point, the operation of the semiconductor integrated circuit device of the present embodiment is the same as that in the first embodiment.

In the present embodiment, the bonding pad 10 is provided in the semiconductor integrated circuit device and the sheet member 8 is provided at the higher level than the bonding pad 10. Therefore, it is possible to fabricate the components from the P-type silicon substrate PSub to the bonding pad 10 by a conventional fabrication process and to fabricate the sheet member 8 by a separate process after the formation of the bonding pad 10. Thus, an existing platform can be used until the fabrication of the bonding pad 10 and therefore the increase of the fabrication cost caused by providing the sheet member 8 can be suppressed. The other effects achieved in the present embodiment are the same as those achieved in the first embodiment.

Moreover, the opening 18 may be filled with the same material as the sheet member 8, for example, vanadium oxide, so as to make the level of the surface of the bonding pad 10 the same as the level of the surface of the sheet member 8.

What is claimed is:

1. A semiconductor integrated circuit device, comprising:
   a semiconductor substrate;
   a multilayer interconnection layer provided on said semiconductor substrate;
   an integrated circuit portion provided in a surface of the semiconductor substrate and in the multilayer interconnection layer;
   a temperature monitor portion provided at a higher level than the multilayer interconnection layer, the temperature monitor portion having electric characteristics that are changed in accordance with a temperature; and
   a detector section, connected to the temperature monitor portion, operable to detect the electric characteristics of the temperature monitor portion to measure the temperature.

2. The semiconductor integrated circuit device according to claim 1, wherein
   said integrated circuit portion is controlled based on an output from the detector section.

3. The semiconductor integrated circuit device according to claim 1, wherein
   at least a part of the integrated circuit portion is arranged directly below the temperature monitor portion.

4. The semiconductor integrated circuit device according to claim 1, wherein
   a plurality of said temperature monitor portions are provided to detect the temperatures of a plurality of positions.

5. The semiconductor integrated circuit device according to claim 1, further comprising a bonding pad provided at the lower level than the temperature monitor portion.

6. The semiconductor integrated circuit device according to claim 1, wherein
   the temperature monitor portion is formed of a material having a resistance that changes in accordance with the temperature, and the detector section detects the resistance of the material.

7. The semiconductor integrated circuit device according to claim 6, wherein
   the material is a metal oxide.

8. The semiconductor integrated circuit device according to claim 7, wherein
   the metal oxide is vanadium oxide.

9. The semiconductor integrated circuit device according to claim 6, wherein
   the material is formed in a shape of sheet.

* * * * *